US011329028B2

United States Patent
Shih

(10) Patent No.: US 11,329,028 B2
(45) Date of Patent: May 10, 2022

(54) SEMICONDUCTOR DEVICE WITH RECESSED PAD LAYER AND METHOD FOR FABRICATING THE SAME

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/945,096

(22) Filed: Jul. 31, 2020

(65) Prior Publication Data
US 2022/0037287 A1 Feb. 3, 2022

(51) Int. Cl.
*H01L 25/065* (2006.01)
*H01L 23/48* (2006.01)
*H01L 21/768* (2006.01)
*H01L 23/00* (2006.01)
*H01L 25/00* (2006.01)

(52) U.S. Cl.
CPC .... *H01L 25/0657* (2013.01); *H01L 21/76898* (2013.01); *H01L 23/481* (2013.01); *H01L 24/08* (2013.01); *H01L 24/80* (2013.01); *H01L 25/50* (2013.01); *H01L 2224/08145* (2013.01); *H01L 2224/80895* (2013.01); *H01L 2224/80896* (2013.01); *H01L 2225/06541* (2013.01)

(58) Field of Classification Search
CPC ......... H01L 2224/80895; H01L 23/481; H01L 25/0657
See application file for complete search history.

(56) References Cited

U.S. PATENT DOCUMENTS

2019/0115322 A1\* 4/2019 Tsai ........................ H01L 25/50

\* cited by examiner

*Primary Examiner* — Dale E Page
*Assistant Examiner* — Wilner Jean Baptiste
(74) *Attorney, Agent, or Firm* — Muncy, Geissler, Olds & Lowe, PC

(57) ABSTRACT

The present application discloses a semiconductor device with a recessed pad layer and a method for fabricating the semiconductor device. The semiconductor device includes a first die, a second die positioned on the first die, a pad layer positioned in the first die, a filler layer including an upper portion and a recessed portion, and a barrier layer positioned between the second die and the upper portion of the filler layer, between the first die and the upper portion of the filler layer, and between the pad layer and the recessed portion of the filler layer. The upper portion of the filler layer is positioned along the second die and the first die, and the recessed portion of the filler layer is extending from the upper portion and positioned in the pad layer.

13 Claims, 18 Drawing Sheets

SEMICONDUCTOR DEVICE WITH
RECESSED PAD LAYER AND METHOD FOR
FABRICATING THE SAME

TECHNICAL FIELD

The present disclosure relates to a semiconductor device and a method for fabricating the semiconductor device, and more particularly, to a semiconductor device with a recessed pad layer and a method for fabricating the semiconductor device with the recessed pad layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first die, a second die positioned on the first die, a pad layer positioned in the first die, a filler layer including an upper portion and a recessed portion, and a barrier layer positioned between the second die and the upper portion of the filler layer, between the first die and the upper portion of the filler layer, and between the pad layer and the recessed portion of the filler layer. The upper portion of the filler layer is positioned along the second die and the first die, and the recessed portion of the filler layer is extending from the upper portion and positioned in the pad layer.

In some embodiments, a depth of the recessed portion of the filler layer is greater than one half of a thickness of the pad layer and less than the thickness of the pad layer.

In some embodiments, a horizontal distance between sidewalls of the upper portion of the filler layer and sidewalls of the recessed portion of the filler layer is equal to or less than the depth of the recessed portion of the filler layer.

In some embodiments, the sidewalls of the recessed portion of the filler layer are curved.

In some embodiments, a bottom surface of the recessed portion of the filler layer is curved.

In some embodiments, the semiconductor device includes isolation layers positioned between the second die and the upper portion of the filler layer and between the first die and the upper portion of the filler layer.

In some embodiments, the semiconductor device includes a passivation layer positioned on the second die and the upper portion of the filler layer is positioned along the passivation layer, the second die, and the first die. The passivation layer is formed of silicon nitride, silicon oxynitride, silicon oxide, silicon nitride oxide, epoxy, polyimide, benzocyclobutene, or polybenzoxazole.

In some embodiments, the semiconductor device includes an adhesion layer positioned between the filler layer and the barrier layer. The adhesion layer is formed of titanium, tantalum, titanium tungsten, or manganese nitride.

In some embodiments, the semiconductor device includes a seed layer positioned between the adhesion layer and the conductive filler layer. The seed layer has a thickness between about 10 nm and about 40 nm.

In some embodiments, the semiconductor device includes pad barrier layers respectively correspondingly positioned on the pad layer and below the pad layer.

In some embodiments, interfaces between the passivation layer and the upper portion of the filler layer are tapered.

In some embodiments, an angle between a top surface of the passivation layer and the interfaces between the passivation layer and the upper portion of the filler layer is between about 120 degree and 135 degree.

In some embodiments, the filler layer is formed of polysilicon, tungsten, copper, carbon nanotube, or solder alloy.

In some embodiments, the isolation layers are formed of silicon oxide, silicon nitride, silicon oxynitride, or tetra-ethyl ortho-silicate.

Another aspect of the present disclosure provides a method for fabricating a semiconductor device including performing a bonding process to bond a second die onto a first die including a pad layer, forming a through-substrate opening along the second die and extending to the pad layer in the first die, conformally forming an isolation layer in the through-substrate opening, performing a punch etch process to remove a portion of the isolation layer and expose a portion of a top surface of the pad layer, performing an isotropic etch process to form a recessed space extending from the through substrate opening and in the pad layer, conformally forming a barrier layer in the through-substrate opening and the recessed space, and forming a filler layer in the through-substrate opening and the recessed space.

In some embodiments, the isotropic etch process has an etch rate ratio of the pad layer to the isolation layer between about 100:1 and about 1.05:1.

In some embodiments, the isolation layer is formed of silicon oxide, silicon nitride, silicon oxynitride, or tetra-ethyl ortho-silicate.

In some embodiments, the filler layer is formed of polysilicon, tungsten, copper, carbon nanotube, or solder alloy.

In some embodiments, the method for fabricating the semiconductor device includes a step of forming a passivation layer on the second die. The through-substrate opening is formed along the passivation layer and the second die and extending to the pad layer in the first die.

In some embodiments, the passivation layer is formed of silicon nitride, silicon oxynitride, silicon oxide, silicon nitride oxide, epoxy, polyimide, benzocyclobutene, or polybenzoxazole.

Due to the design of the semiconductor device of the present disclosure, the upper portion of the filler layer may increase the contact surface between the filler layer and the barrier layer so as to achieve a reduced contact resistance of the barrier layer. As a result, the reliability of the semiconductor device may be improved. In addition, due to the geometry of the protection layers, the filler layer may be formed without any void. Accordingly, the yield of fabrication of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
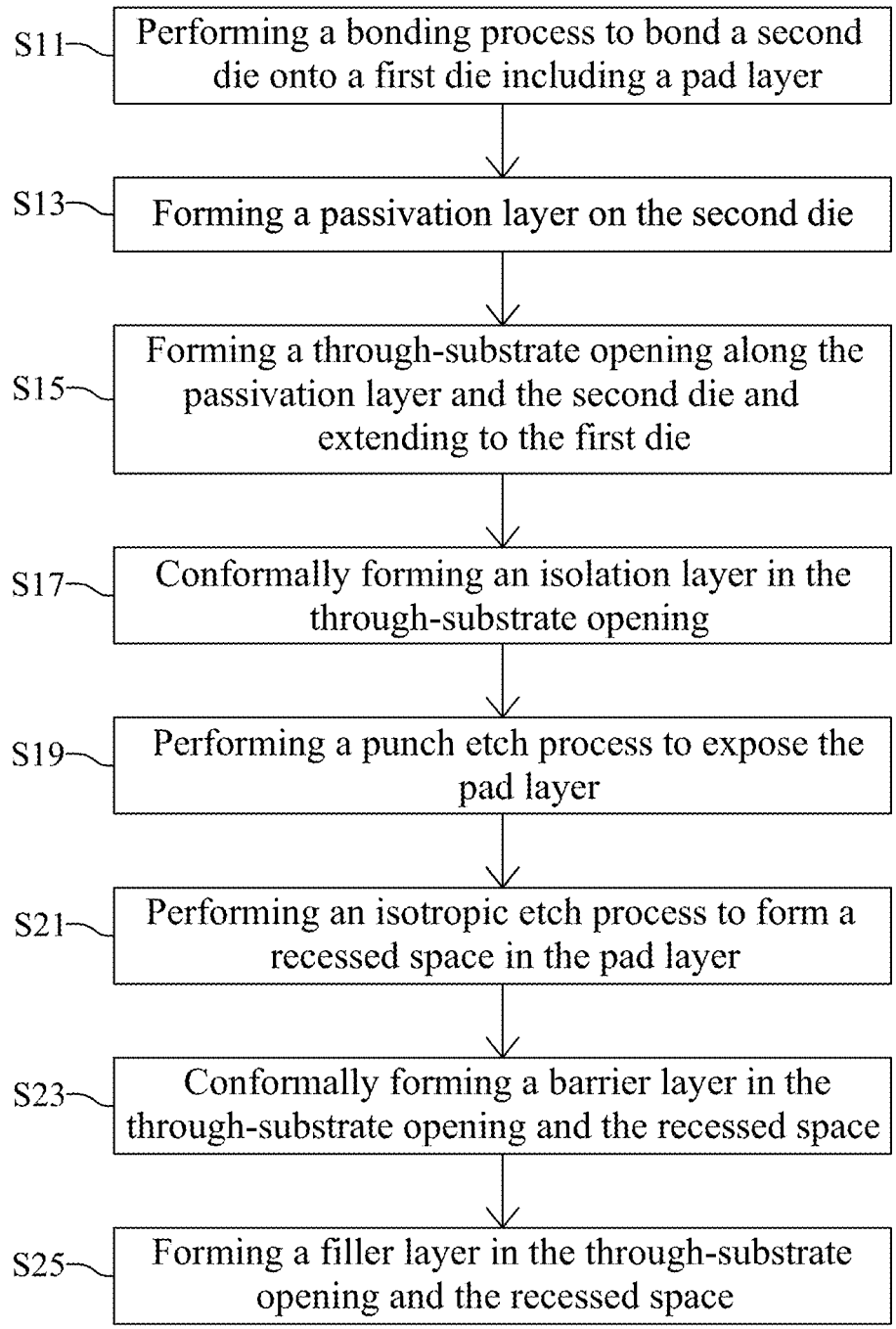
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these teams are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, a "depth" refers to a vertical size of an element (e.g., a layer, trench, hole, opening, etc.) in a cross-sectional perspective measured from a top surface to a bottom surface of the element; a "width" refers to a size of an element (e.g., a layer, trench, hole, opening, etc.) in a cross-sectional perspective measured from a side surface to an opposite surface of the element. The term "thickness" may substitute for "width" and/or "depth" where indicated.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 1A in accordance with one embodiment of the present disclosure. FIGS. 2 to 10 illustrate, in schematic cross-sectional view diagrams, a flow for fabricating the semiconductor device 1A in accordance with one embodiment of the present disclosure.

Figure 2:
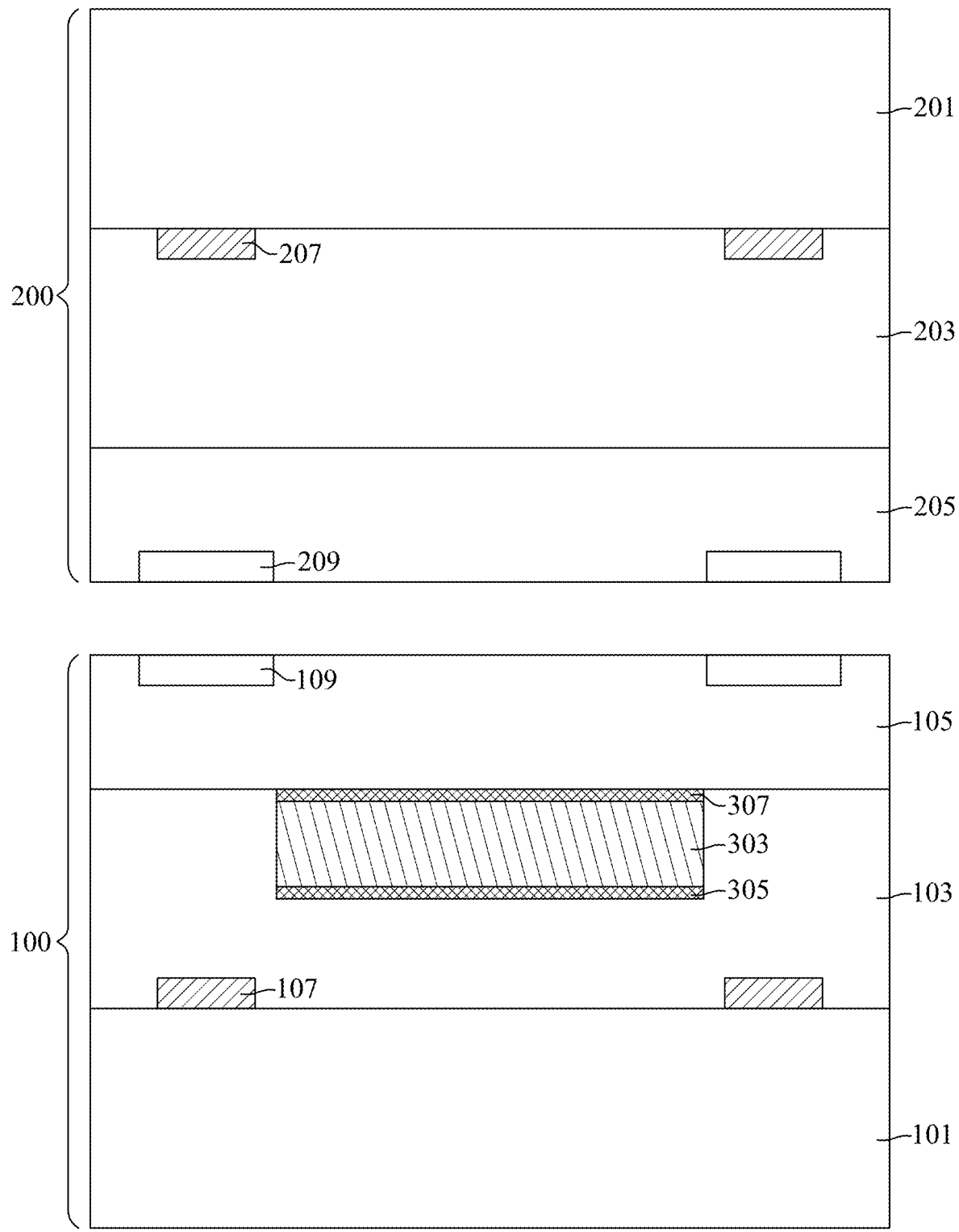
FIGS. 2 to 10 illustrate, in schematic cross-sectional view diagrams, a flow for fabricating the semiconductor device in accordance with one embodiment of the present disclosure.

With reference to FIGS. 1 and 2, at step S11, a bonding process may be performed to bond a second die 200 onto a first die 100 including a pad layer 303.

With reference to FIG. 2, the first die 100 and the second die 200 may be separately prepared but is not limited thereto. The first die 100 and the second die 200 may provide different functionalities. For example, the first die 100 may provide a logic function and the second die 200 may provide a memory function. In some embodiments, the first die 100 and the second die 200 may provide the same functionality.

With reference to FIG. 2, the first die 100 may include a first substrate 101, a first dielectric layer 103, a first bonding layer 105, first device elements 107, and first dummy conductive layers 109.

With reference to FIG. 2, in some embodiments, the first substrate 101 may be a bulk semiconductor substrate that is composed entirely of at least one semiconductor material. The semiconductor material that provides the bulk semiconductor substrate may include any material, or stack of materials, having semiconducting properties including, but not limited to, silicon, germanium, silicon germanium alloys, III-V compound semiconductors, or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

With reference to FIG. 2, in some embodiments, the first substrate 101 may include a semiconductor-on-insulator structure which consisting of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

In some embodiments, the semiconductor-on-insulator structure may be formed by wafer bonding. In some embodiments, the semiconductor-on-insulator structure may be formed by an implantation process such as separation by implanting oxygen. In some embodiments, a thermal mixing process or a thermal condensation process may be employed in forming the topmost semiconductor material layer of the semiconductor-on-insulator structure. The thermal mixing process may include annealing in an inert ambient (i.e., helium and/or argon), while the thermal condensation process may include annealing in an oxidizing ambient (air, oxygen, ozone and/or $NO_2$). The anneal temperature for both the thermal mixing process and the thermal condensation process may be between about 600° C. and about 1200° C.

With reference to FIG. 2, the first dielectric layer 103 may be formed on the first substrate 101. The first dielectric layer 103 may be a stacked layer structure. The first dielectric layer 103 may include a plurality of first insulating sub-layers. Each of the plurality of first insulating sub-layers may have a thickness between about 0.5 micrometer and about 3.0 micrometer. The plurality of first insulating sub-layers may be formed of, for example, silicon oxide, borophosphosilicate glass, undoped silicate glass, fluorinated silicate glass, low-k dielectric materials, the like, or a combination thereof. The plurality of first insulating sub-layers may be formed of different materials but is not limited thereto. The low-k dielectric materials may have a dielectric constant less than 3.0 or even less than 2.5. In some embodiments, the low-k dielectric materials may have a dielectric constant less than 2.0.

The first dielectric layer 103 may be formed by deposition processes such as chemical vapor deposition, plasma enhanced chemical vapor deposition, evaporation, or spin-on coating. Planarization processes may be respectively correspondingly performed after the deposition processes to remove excess material and provide a substantially flat surface for subsequent processing steps. The first device elements 107, the conductive features (not shown), the pad layer 303, and the pad barrier layers 305, 307 may be formed during the formation of the first dielectric layer 103.

With reference to FIG. 2, the pad layer 303 may be formed in the first dielectric layer 103. The pad barrier layers 305, 307 may be respectively correspondingly formed on the pad layer 303 and below the pad layer 303. In some embodiments, the top surface of the pad barrier layer 307 may be substantially coplanar with the top surface of the first dielectric layer 103. The top surface of the first bonding layer 105 may be referred to as the top surface of the first die 100. The pad layer 303 may be formed of, for example, aluminum, copper, aluminum-copper alloy, aluminum alloy, copper alloy, or other suitable conductive materials. The pad barrier layers 305, 307 may be formed of, for example, titanium, titanium nitride, tantalum, tantalum nitride, or titanium/titanium nitride bi-layer. The pad layer 303 and the pad barrier layers 305, 307 may be formed by deposition processes such as chemical vapor deposition, physical vapor deposition, evaporation, or sputtering and subsequent photo-etch process defining the pattern of the pad layer 303 and the pattern of the pad barrier layers 305, 307.

With reference to FIG. 2, the first bonding layer 105 may be formed on the first dielectric layer 103. In some embodiments, the first bonding layer 105 may be formed of, for example, a non-organic material selected from un-doped silicate glass, silicon nitride, silicon oxynitride, silicon oxide, silicon nitride oxide, and combinations thereof. In some embodiments, the first bonding layer 105 may be formed of, for example, a polymer layer such as an epoxy, polyimide, benzocyclobutene, polybenzoxazole, or the like. The first bonding layer 105 may be formed by a deposition process such as chemical vapor deposition, plasma enhanced chemical vapor deposition, evaporation, or spin-on coating.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 2, the first dummy conductive layers 109 may be formed in the first bonding layer 105 by a damascene process. The top surfaces of the first dummy conductive layers 109 may be substantially coplanar with the top surface of the first bonding layer 105. The first dummy conductive layers 109 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof.

It should be noted that, in the description of the present disclosure, referring to an element as a "dummy" element means that no exterior voltage or current is applied to the element when the semiconductor device 1A is in operation.

With reference to FIG. 2, the second die 200 may have a similar structure with the first die 100. The second die 200 may include a second substrate 201, a second dielectric layer 203, a second bonding layer 205, second device elements 207, and second dummy conductive layers 209. The similar reference numbers between the first die 100 and the second die 200 may be formed of a same material and may be formed by a similar process but is not limited thereto. For example, the second substrate 201 may be formed of a same material as the first substrate 101.

With reference to FIG. 2, the second die 200 may be placed in an up-side down manner during the bonding process. That is, the first die 100 and the second die 200 may be bonded in a face-to-face manner. Specifically, the second bonding layer 205 may be placed above the first die 100 during the bonding process. The second dielectric layer 203 may be on the second bonding layer 205. The second substrate 201 may be on the second dielectric layer 203. The second dummy conductive layers 209 may be in the second bonding layer 205. The bottom surfaces of the second dummy conductive layers 209 may be substantially coplanar with the bottom surface of the second bonding layer 205. In some embodiments, the second die 200 and the first die 100 may be bonded in a back-to-face manner.

In some embodiments, a thermal treatment may be performed to achieve a hybrid bonding between elements of the second die 200 and the first die 100 for the bonding process. A temperature of bonding process may be between about 300° C. and about 450° C. The hybrid bonding may include a dielectric-to-dielectric bonding and/or a metal-to-metal bonding. The dielectric-to-dielectric bonding may originate from the bonding between the second bonding layer 205 and the first bonding layer 105. The metal-to-metal bonding may originate from the bonding between the second dummy conductive layers 209 and the first dummy conductive layers 109. That is, the first dummy conductive layers 109 and the second dummy conductive layers 209 may facilitate the bonding process between the first die 100 and the second die 200. In addition, the first dummy conductive layers 109 and the second dummy conductive layers 209 may respectively correspondingly improve the mechanical strength of the first die 100 and the second die 200.

Figure 3:
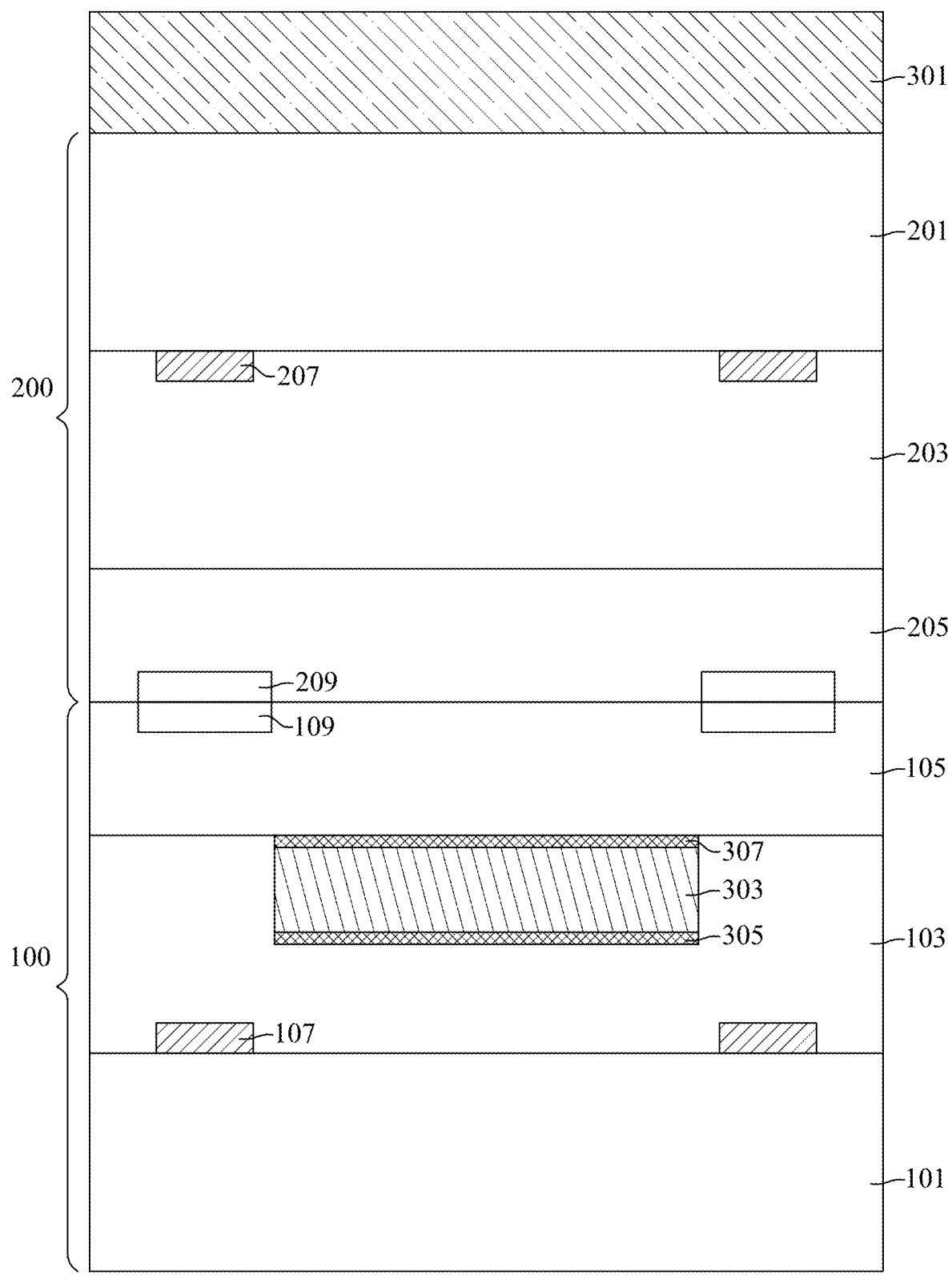

With reference to FIGS. 1 and 3, at step S13, a passivation layer 301 may be formed on the second die 200.

With reference to FIG. 3, a thinning process may be performed on the second substrate 201 using an etching process, a chemical polishing process, or a grinding process to reduce the thickness of the second substrate 201.

With reference to FIG. 3, the passivation layer 301 may be formed by a deposition process such as chemical vapor deposition, plasma enhanced chemical vapor deposition, evaporation, or spin-on coating. In some embodiments, the passivation layer 301 may be formed of, for example, a non-organic material selected from silicon nitride, silicon oxynitride, silicon oxide, silicon nitride oxide, and combinations thereof. In some embodiments, the passivation layer 301 may be formed of, for example, a polymer layer such as an epoxy, polyimide, benzocyclobutene, polybenzoxazole, or the like. In some embodiments, the passivation layer 301 may be formed of a material having etching selectivity to the second substrate 201 of the second die 200. In some embodiments, the passivation layer 301 may serve as a high vapor barrier in order to prevent moisture from entering from above. In some embodiments, the passivation layer 301 may be employed as a hard mask layer during the formation of a through-substrate opening as will be fabricated later. In some embodiments, the passivation layer 301 may be employed as a buffer layer to prevent a metal to silicon leakage during the formation of a filler layer as will be fabricated later.

Figure 4:
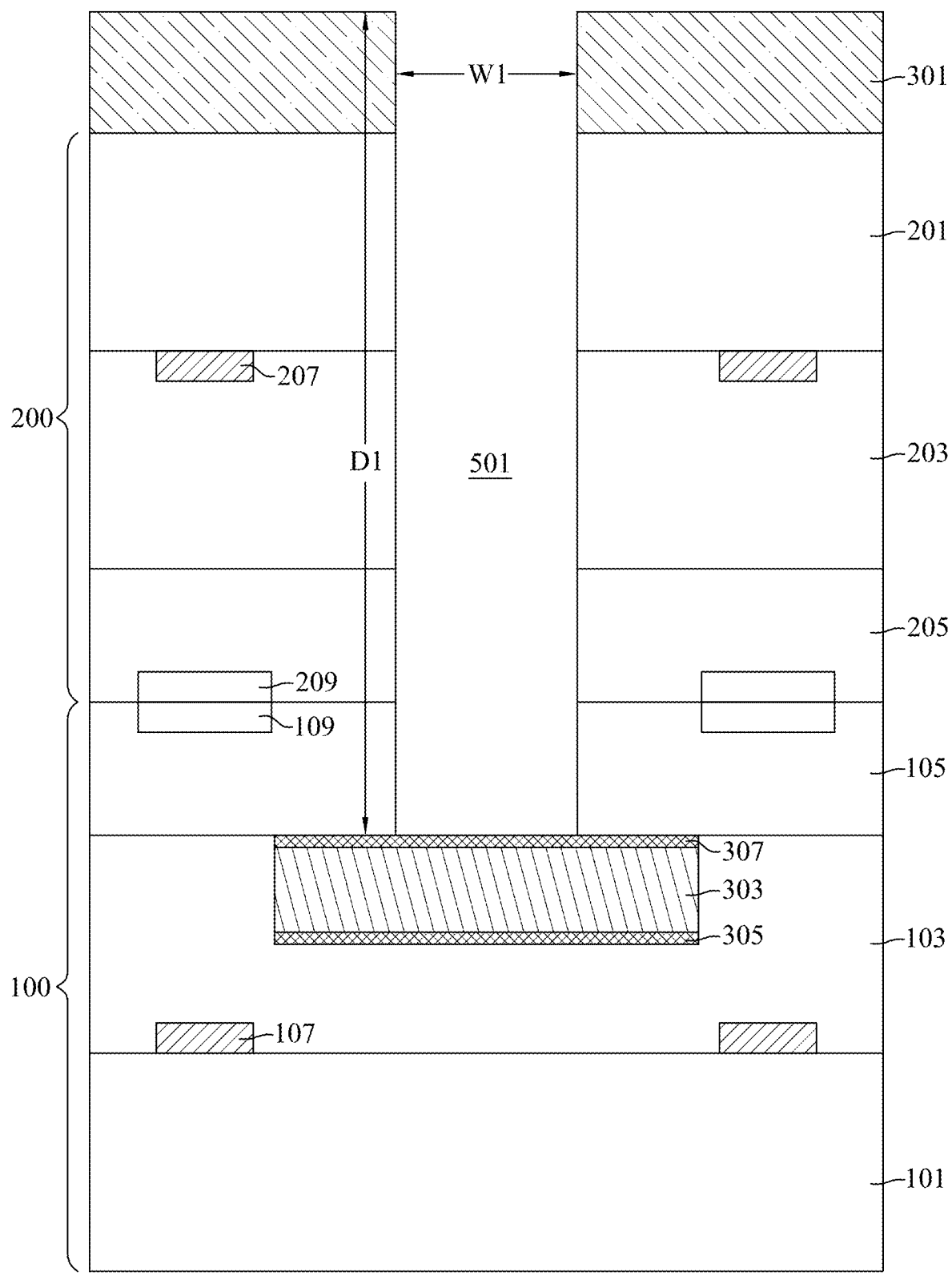

With reference to FIGS. 1 and 4, at step S15, a through-substrate opening 501 may be formed along the passivation layer 301 and the second die 200 and extending to the top surface of the pad barrier layer 307.

With reference to FIG. 4, the through-substrate opening 501 may be formed by using one or more etching processes, milling, laser techniques, or the like. A portion of the top surface of the pad barrier layer 307 may be exposed through the through-substrate opening 501. In some embodiments, a width W1 of the through-substrate opening 501 may be between about 5 μm and about 15 μm. In some embodiments, the through-substrate opening 501 may have a depth D1 between about 20 μm and about 160 μm. Specifically, the depth D1 of the through-substrate opening 501 may be between about 50 μm and about 130 μm. In some embodiments, the through-substrate opening 501 may have an aspect ratio between about 1:2 and about 1:35. Specifically, the aspect ratio of the through-substrate opening 501 may be between about 1:1.0 and about 1:25.

Figure 5:
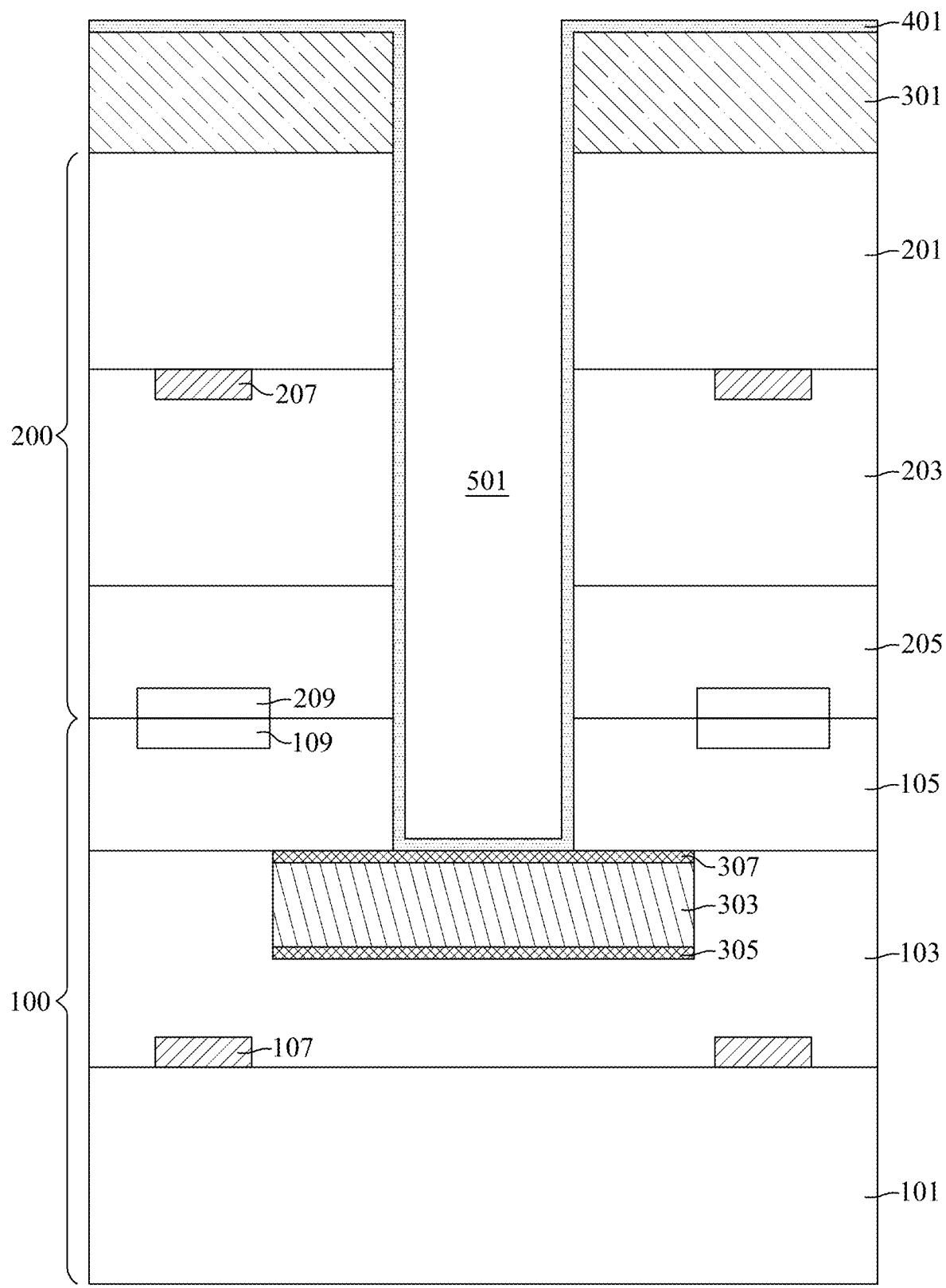

With reference to FIGS. 1 and 5, at step S17, an isolation layer 401 may be conformally formed in the through-substrate opening 501.

With reference to FIG. 5, specifically, the isolation layer 401 may be conformally formed in the through-substrate opening 501 and may be conformally formed on the top surface of the passivation layer 301. In some embodiments, the isolation layer 401 may be formed of, for example, silicon oxide, silicon nitride, silicon oxynitride, tetra-ethyl ortho-silicate, or combination thereof. The isolation layer 401 may have a thickness between about 50 nm and about 200 nm. The isolation layer 401 may be formed by, for example, chemical vapor deposition or plasma enhanced chemical vapor deposition. In some embodiments, the isolation layer 401 may be formed of, for example, parylene, epoxy, or poly(p-xylene). The isolation layer 401 may have a thickness between about 1 μm and about 5 μm. The isolation layer 401 may be formed by, for example, spin-on coating with a subsequent curing.

Figure 6:
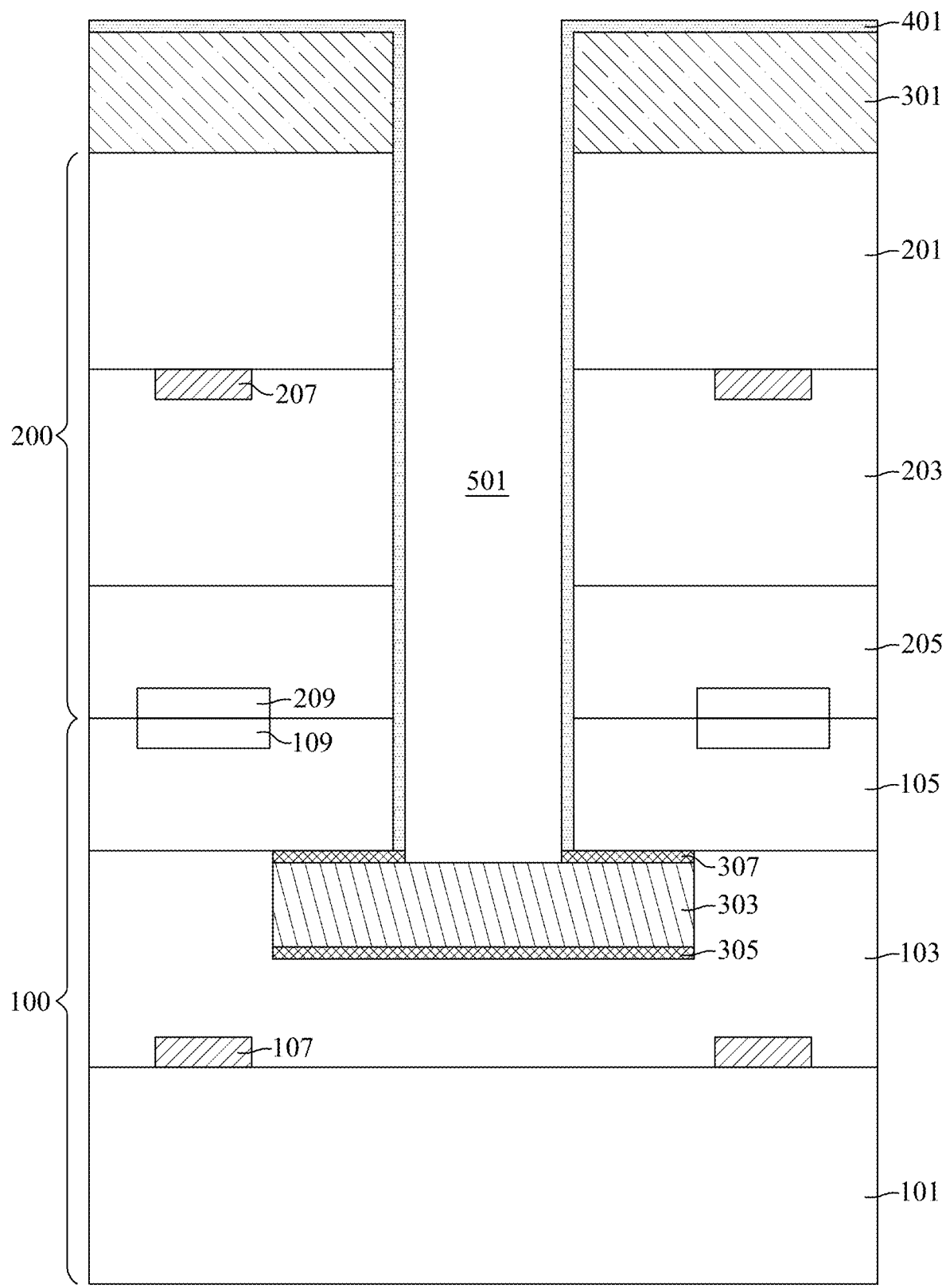

With reference to FIGS. 1 and 6, at step S19, a punch etch process may be performed to expose a portion of a top surface of the pad layer 303.

With reference to FIG. 6, during the punch etch process, the isolation layer 401 formed on the top surface of the pad barrier layer 307 may be removed and the portion of the pad barrier layer 307, which subsequently exposed after the removal of the isolation layer 401 formed on the top surface of the pad layer 303, may be also removed. As a result, the portion of the top surface of the pad layer 303 may be exposed.

The punch etch process may be an anisotropic etch process such as anisotropic dry etch process so as to the isolation layer 401 formed on the sidewalls of the through-substrate opening 501 may be still intact. After the punch etch process, the isolation layer 401 may be divided into multiple portions. In some embodiments, the etch rate of the isolation layer 401 of the punch etch process may be faster than the etch rate of the passivation layer 301 of the punch etch process to avoid the silicon/hard mask layer interface damage. In some embodiments, the etch rate of the pad barrier layer 307 of the punch etch process may be faster than the etch rate of the pad layer 303 of the punch etch process. The isolation layer 401 may electrically isolate a filler layer, which will be fabricated later, in the passivation layer 301, the second die 200, and the first passivation layer 105. In some embodiments, the isolation layer 401 formed on the top surface of the passivation layer 301 may be also removed during the punch etch process (not shown in FIG. 6).

Figure 7:
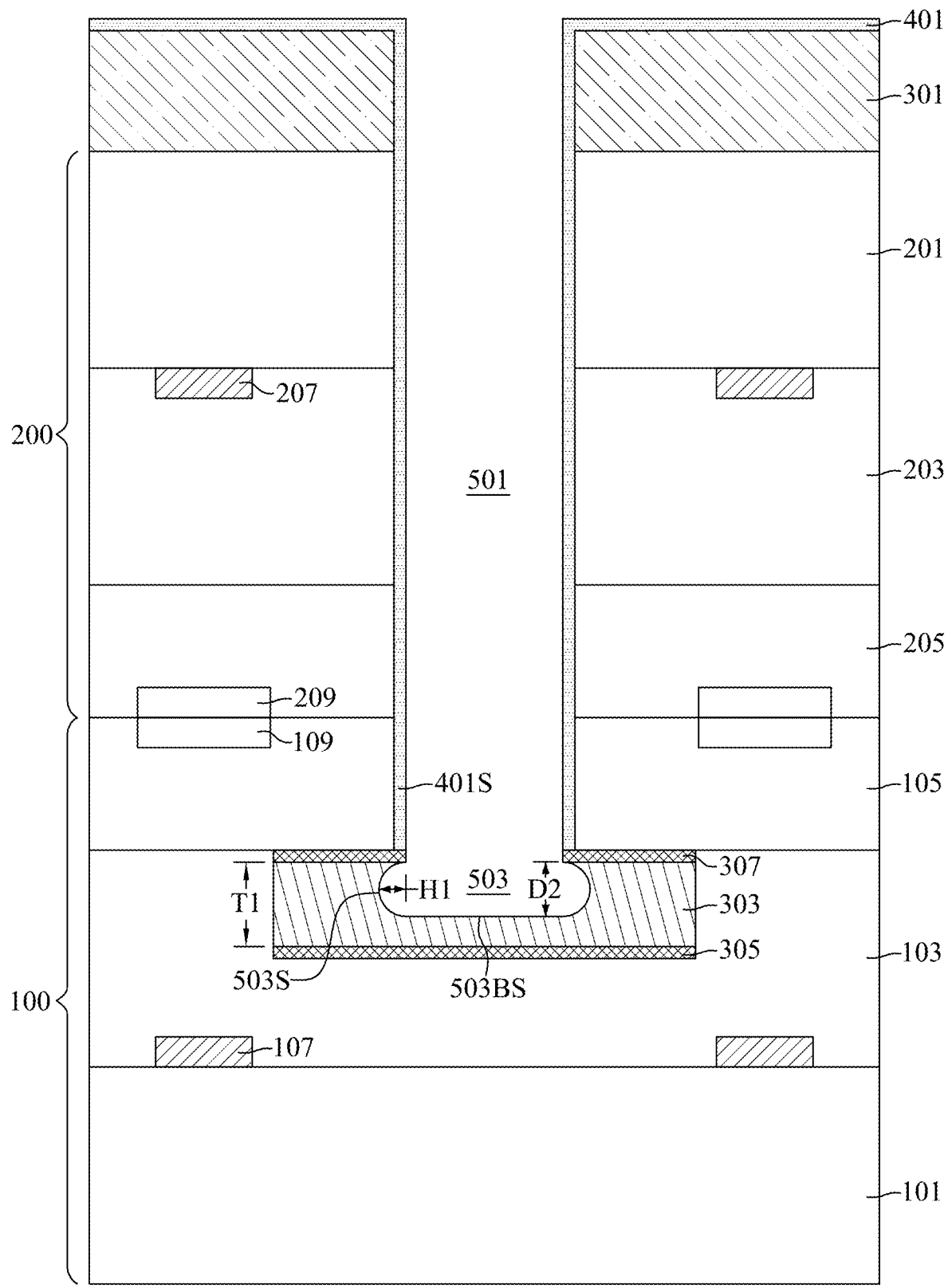

With reference to FIGS. 1 and 7, at step S21, an isotropic etch process may be performed to form a recessed space 503 in the pad layer 303.

With reference to FIG. 7, in some embodiments, the etch rate of the pad layer 303 of the isotropic etch process may be faster than the etch rate of the isolation layer 401 of the isotropic etch process. For example, an etch rate ratio of the pad layer 303 to the isolation layer 401 may be between about 100:1 and about 1.05:1 during the isotropic etch process. For another example, the etch rate ratio of the pad layer 303 to the isolation layer 401 may be between about 20:1 and about 10:1 during the isotropic etch process.

With reference to FIG. 7, the recessed space 503 may be formed downwardly extending from the through-substrate opening 501. A depth D2 of the recessed space 503, which is the vertical distance between a bottom surface of the pad barrier layer 307 and a bottom surface 503BS of the recessed space 503, may be greater than one half of a thickness T1 of the pad layer 303 and less than the thickness T1 of the pad layer 303. A horizontal distance H1 between the sidewall 401S of the isolation layer 401 and a sidewall 503S of the recessed space 503 may be equal to or less than the depth D2 of the recessed space 503. In some embodiments, the bottom surface 503BS of the recessed space 503 and the sidewalls 503S of the recessed space 503 may be flat. In some embodiments, the bottom surface 503BS of the recessed space 503 and the sidewalls 503S of the recessed space 503 may be curved. In some embodiments, the intersections of the bottom surface 503BS of the recessed space 503 and the sidewalls 503S of the recessed space 503 may be curved. Corner effects may be avoided if the intersections are curved.

Figure 8:
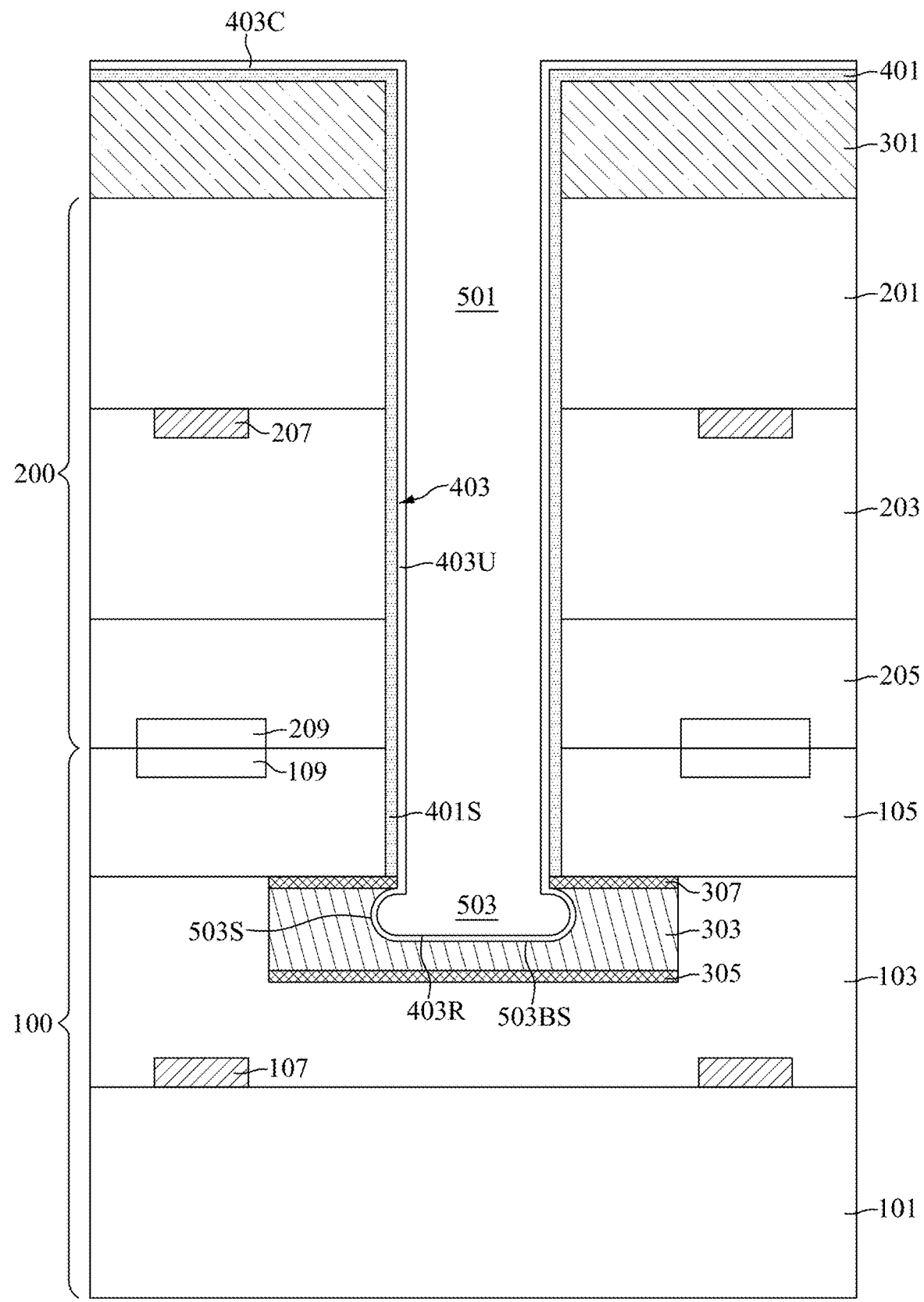

With reference to FIGS. 1 and 8, at step S23, a barrier layer 403 may be conformally formed in the through-substrate opening 501 and the recessed space 503.

With reference to FIG. 8, the barrier layer 403 may be formed on the top surface of the isolation layer 401, the sidewalls 401S of the isolation layer 401, the sidewalls of the pad barrier layer 307, the sidewalls 503S of the recessed space 503, and the bottom surface 503BS of the recessed space 503. The barrier layer 403 formed on the top surface of the isolation layer 401 may be referred to as the covering portion 403C of the barrier layer 403. The barrier layer 403 formed on the sidewalls 401S of the isolation layer 401 and the sidewalls of the pad barrier layer 307 may be referred to as the upper portion 403U of the barrier layer 403. The barrier layer 403 formed on the sidewalls 503S of the recessed space 503 and the bottom surface 503BS of the recessed space 503 may be referred to as the recessed portion 403R of the barrier layer 403.

The barrier layer 403 may be formed of, for example, tantalum, tantalum nitride, titanium, titanium nitride, rhenium, nickel boride, or tantalum nitride/tantalum bilayer. The barrier layer 403 may be formed by deposition process such as physical vapor deposition, atomic layer deposition, chemical vapor deposition, or sputtering. The barrier layer 403 may inhibit diffusion of the conductive materials of a filler layer, which will be fabricated later, into the passivation layer 301, the second die 200, and the first bonding layer 105. In addition, the recessed portion 403R of the barrier layer 403 may increase the contact surface between the barrier layer 403 and the pad layer 303. Hence, the contact resistance of the barrier layer 403 may be reduced. As a result, the reliability of the semiconductor device 1A may be improved.

In contrast, if the recessed space 503 is not formed, the barrier layer 403 may be directly formed on the exposed portion of the pad layer 303 in the through-substrate opening 501. In such situation, the contact surface between the barrier layer 403 and the pad layer 303 is less than aforementioned contact surface between the recessed portion 403R of the barrier layer 403 and the pad layer 303. Accordingly, the contact resistance of the barrier layer 403 may be higher and related reliability issues may be raised.

With reference to FIG. 8, an adhesion layer (not shown for clarity) may be conformally formed on the barrier layer 403 and in the through-substrate opening 501 and the recessed space 503. The adhesion layer may be of, for example, titanium, tantalum, titanium tungsten, or manganese nitride. The adhesion layer may be formed by deposition process such as physical vapor deposition, atomic layer deposition, chemical vapor deposition, or sputtering. The adhesion layer may improve an adhesion between a seed layer, which will be fabricated later, and the barrier layer 403.

With reference to FIG. 8, a seed layer (not shown for clarity) may be conformally formed on the adhesion layer and in the through-substrate opening 501 and the recessed space 503. The seed layer may have a thickness between about 10 nm and about 40 nm. The seed layer may be formed of, for example, copper. The seed layer may be formed by deposition process such as physical vapor deposition, atomic layer deposition, chemical vapor deposition, or sputtering. The seed layer may reduce a resistivity of the through-substrate opening 501 and the recessed space 503 during the formation of a filler layer.

Figure 9:
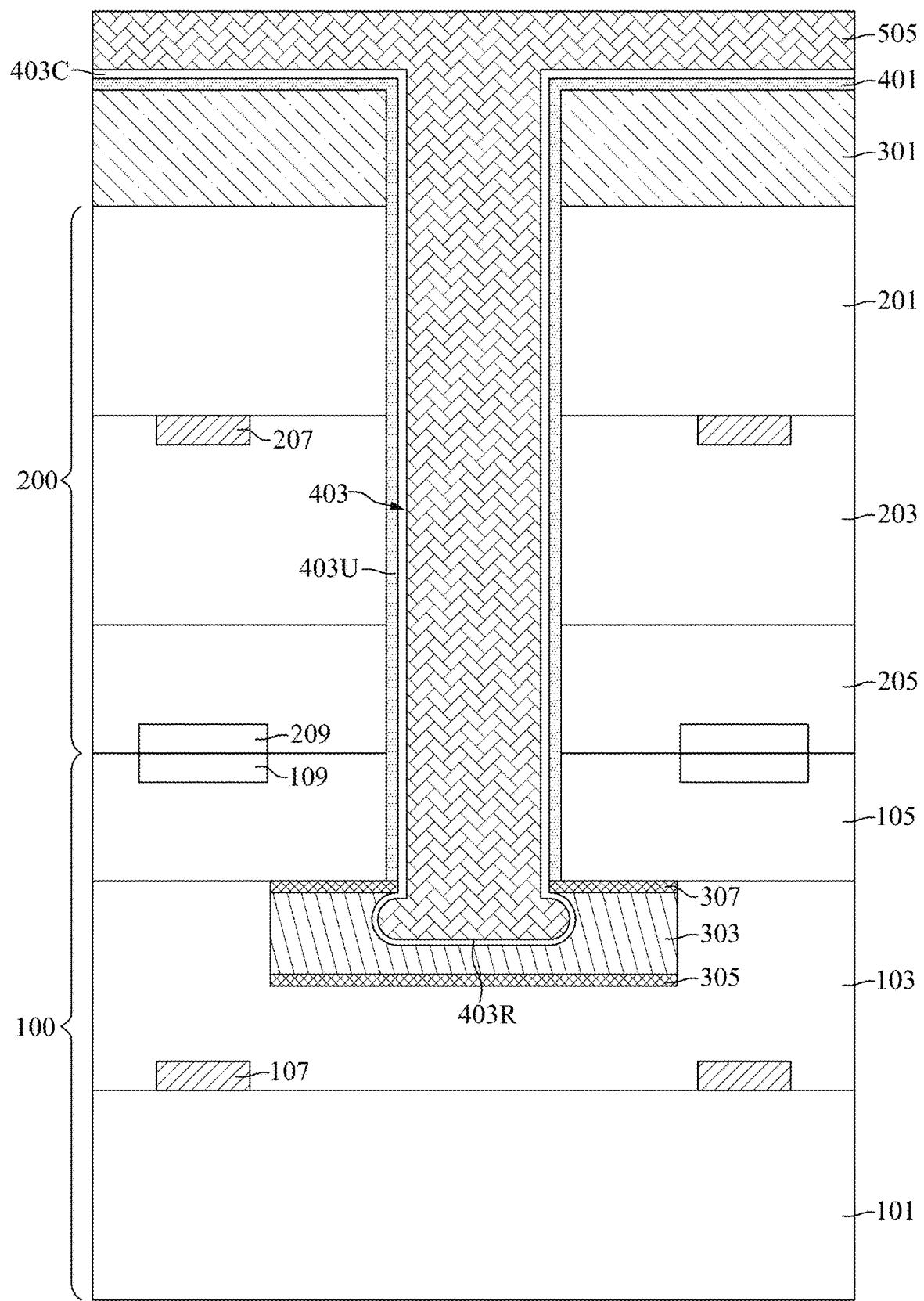
Figure 10:
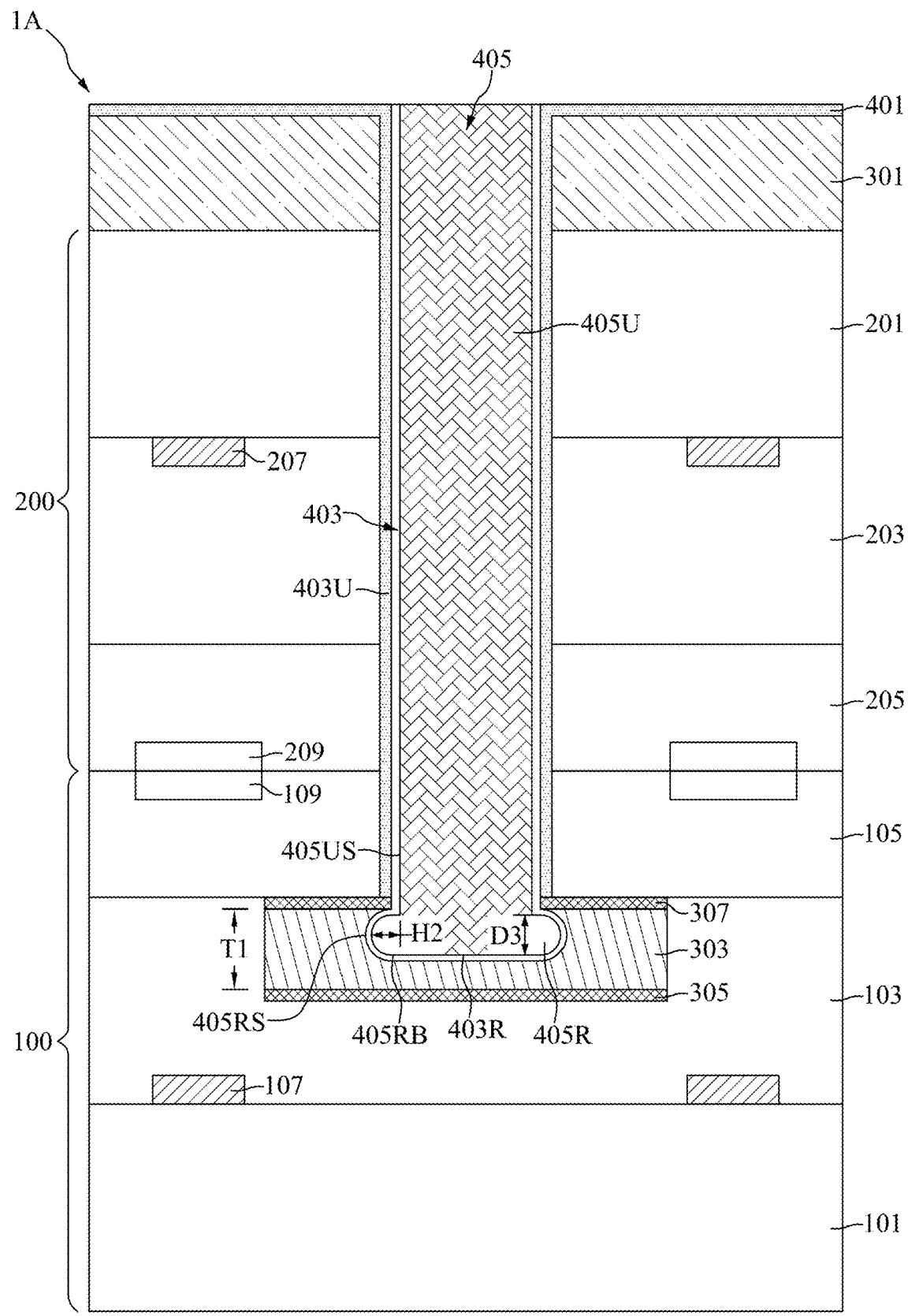

With reference to FIGS. 1, 9, and 10, at step S25, a filler layer 405 may be formed in the through-substrate opening 501 and the recessed space 503.

With reference to FIG. 9, a layer of conductive material 505 may be formed to complete fill the through-substrate opening 501 and the recessed space 503 and cover the covering portion 403C of the barrier layer 403. The conductive material 505 may be formed of, for example, polysilicon, tungsten, copper, carbon nanotube, or solder alloy. The layer of conductive material 505 may be formed by electroplating, physical vapor deposition, chemical vapor deposition, or sputtering.

For example, the layer of conductive material 505 may be formed in the through-substrate opening 501 and the recessed space 503 by electroplating in an acid bath including copper sulphate, sulfuric acid, sodium chloride, a suppressor, an accelerator, and a leveler. The suppressor may interact with chloride ions to inhibit copper deposition. The accelerator may adsorb on the electrode surface, where the accelerator may gradually replace the suppressor, thus allowing electroplating of copper to take place. The leveler may be used to improve filling performance, decrease the surface roughness and prevent copper deposition at the upper portion of the through-substrate opening 501. The suppressor may be, for example, polymers such as polyethylene glycol. The accelerator and the leveler may be, for example, 3-mercapto-1-propanesulfonate, (3-sulfopropyl) disulfide, or 3,3-thiobis (1-propanesulfonate).

In some embodiments, an annealing process may be performed to the intermediate semiconductor device illustrated in FIG. 9. The annealing process may reduce the adverse effects of copper-pumping during subsequent semiconductor processes, improve the adhesion between the layer of conductive material 505 and the isolation layer 401, and stabilize the microstructure of the layer of conductive material 505.

With reference to FIG. 10, a planarization process, such as chemical mechanical polishing or grinding, may be performed until the isolation layer 401 is exposed to remove excess material, provide a substantially flat surface for subsequent processing steps, and concurrently turn the layer of conductive material 505 into the filler layer 405. In some embodiments, the planarization process may be performed until the passivation layer 301 is exposed. In some embodiments, the planarization process may be performed until the second substrate 201 is exposed.

With reference to FIG. 10, the filler layer 405 formed in the through-substrate opening 501 may be referred to as the upper portion 405U of the filler layer 405. The filler layer 405 formed in the recessed space 503 may be referred to as the recessed portion 405R of the filler layer 405. A depth D3 of the recessed portion 405R may be greater than one half of the thickness T1 of the pad layer 303 and less than the thickness T1 of the pad layer 303. A horizontal distance H2 between the sidewall 405US of the upper portion 405U and a sidewall 405RS of the recessed portion 405R may be equal to or less than the depth D3 of the upper portion 405U.

It should be noted that the same or similar reference numbers used throughout the drawings are used to denote the same or similar features, elements, or structures, and thus, a detailed explanation of the same or similar features, elements, or structures will not be repeated for each of the drawings.

FIGS. 11 to 14 illustrate, in schematic cross-sectional view diagrams, a flow for fabricating a semiconductor device 1B in accordance with another embodiment of the present disclosure.

Figure 11:
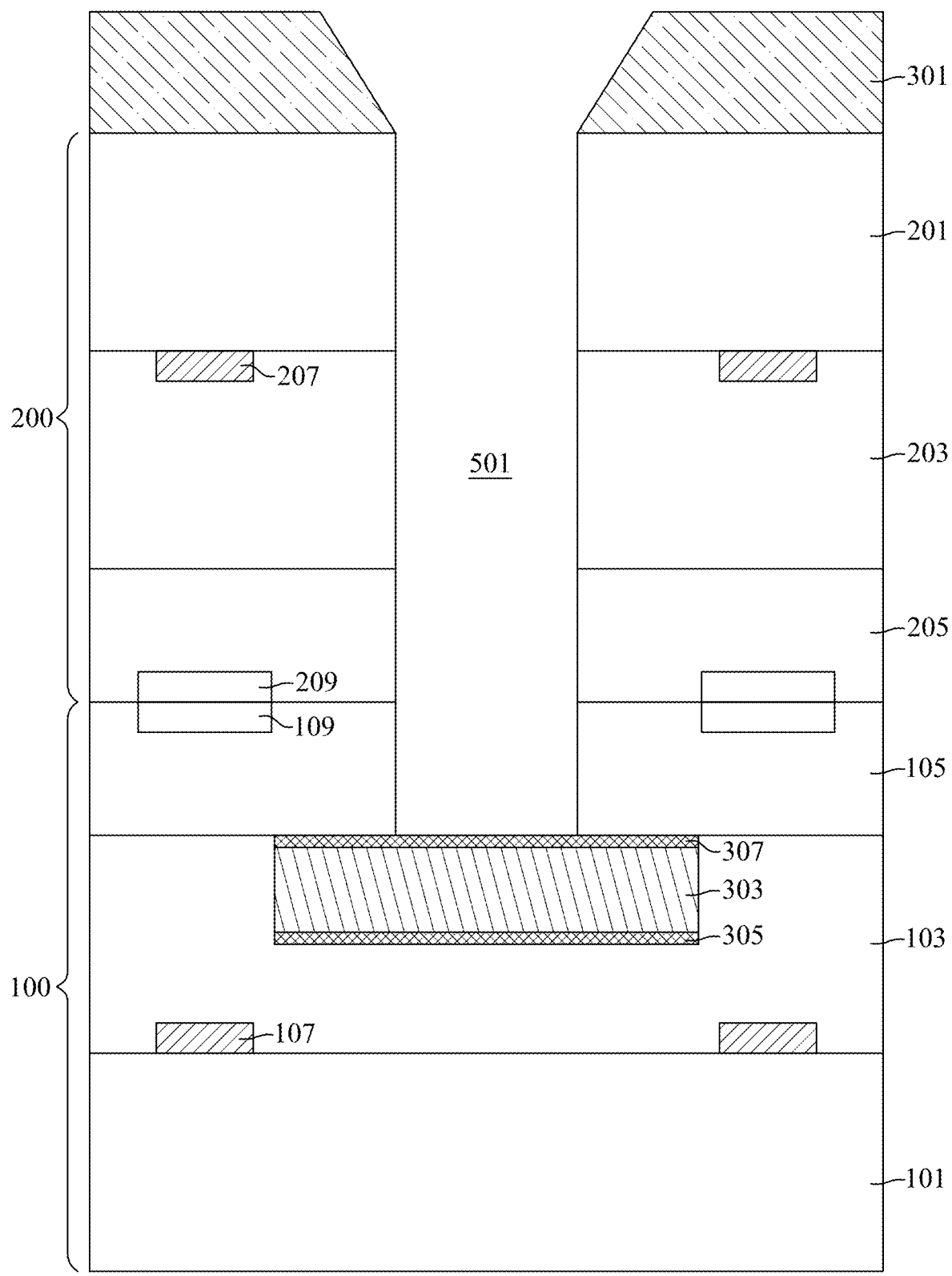
FIGS. 11 to 14 illustrate, in schematic cross-sectional view diagrams, a flow for fabricating a semiconductor device in accordance with another embodiment of the present disclosure.

With reference to FIG. 11, an intermediate semiconductor device may be fabricating with a procedure similar to that illustrated in FIGS. 2 to 4. An expansion etch process may be performed to expand the through-substrate opening 501 in the passivation layer 301. During the expansion etch process, an etch rate ratio of the passivation layer 301 to the second substrate 201 of the second die 200 may be between about 100:1 and about 1.05:1. In some embodiments, the expansion etch process may be a wet etch process using a wet etch solution. The wet etch solution may be a hydrofluoride solution having 6:1 buffer oxide etchant and including 7% w/w hydrofluoric acid, 34% w/w ammonium fluoride, and 59% w/w water. In some embodiments, the expansion etch process may be a dry etch process using gas selected from the group consisting of $CH_2F_2$, $CHF_3$, and $C_4F_8$.

After the expansion etch process, the width of the through-substrate opening 501 in the passivation layer 301 may be broaden and the width of the through-substrate opening 501 in the second die 200 or the first die 100 may be unchanged. As a result, the sidewalls of the through-substrate opening 501 in the passivation layer 301 may be tapered after the expansion etch process. The broaden through-substrate opening 501 in the passivation layer 301 may gain an improved tolerance window, by providing additional spaces to eliminate the adverse effect originating from the faster deposition rate at the through-substrate opening 501 in the passivation layer 301, for the formation of void-free filler layers.

Figure 12:
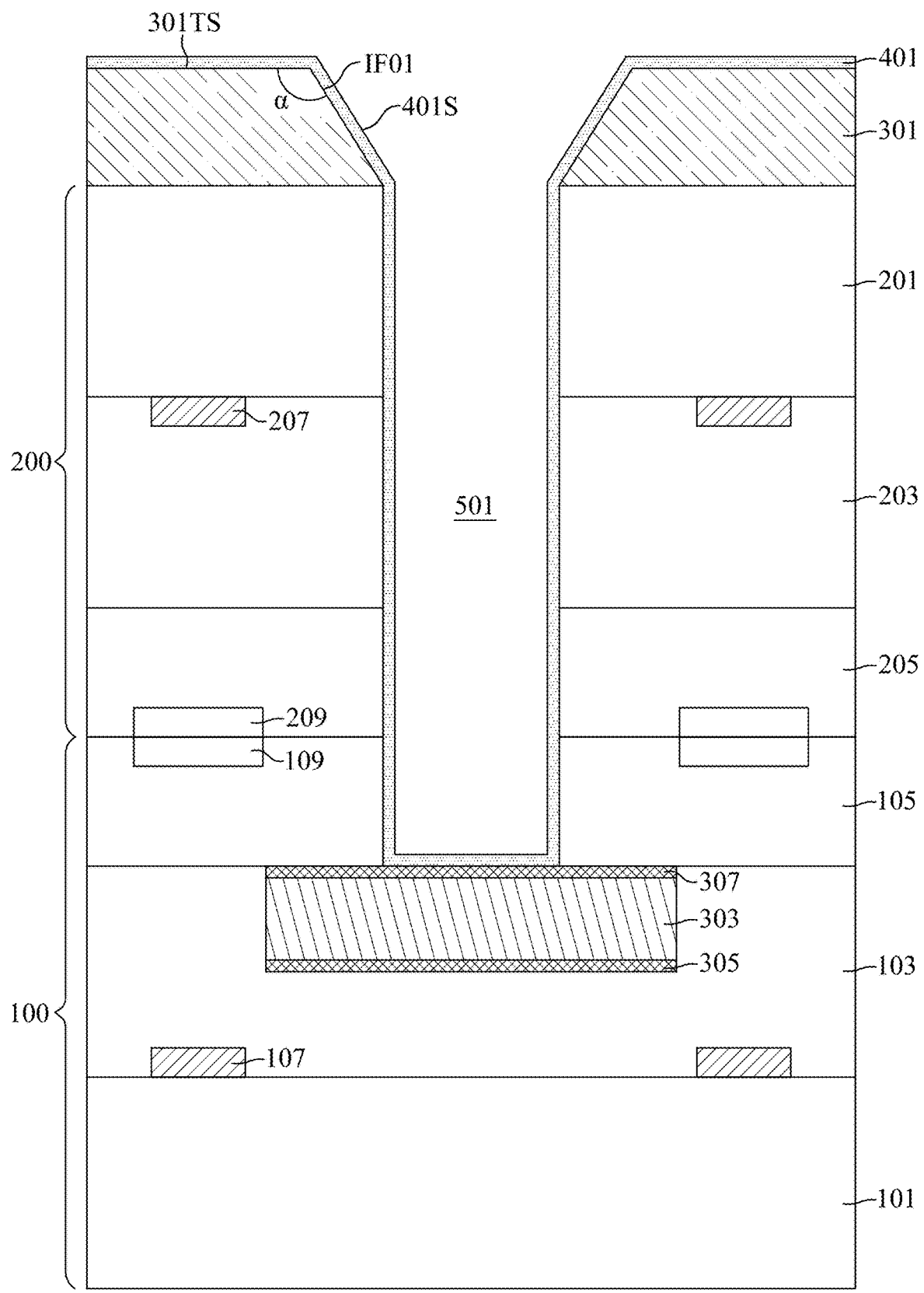

With reference to FIG. 12, the isolation layer 401 may be conformally formed in the through-substrate opening 501 and may be conformally formed on the top surface of the passivation layer 301. The interface IF01 between the passivation layer 301 and the isolation layer 401 may be tapered. The sidewalls 401S of the isolation layer 401 in the passivation layer 301 may be also tapered. The isolation layer 401 may be formed with a procedure similar to that illustrated in FIG. 5. An angle α between the top surface 301TS of the passivation layer and the interfaces IF01 between the between the passivation layer 301 and the isolation layer 401 may be between about 120 degree and 135 degree.

Figure 13:
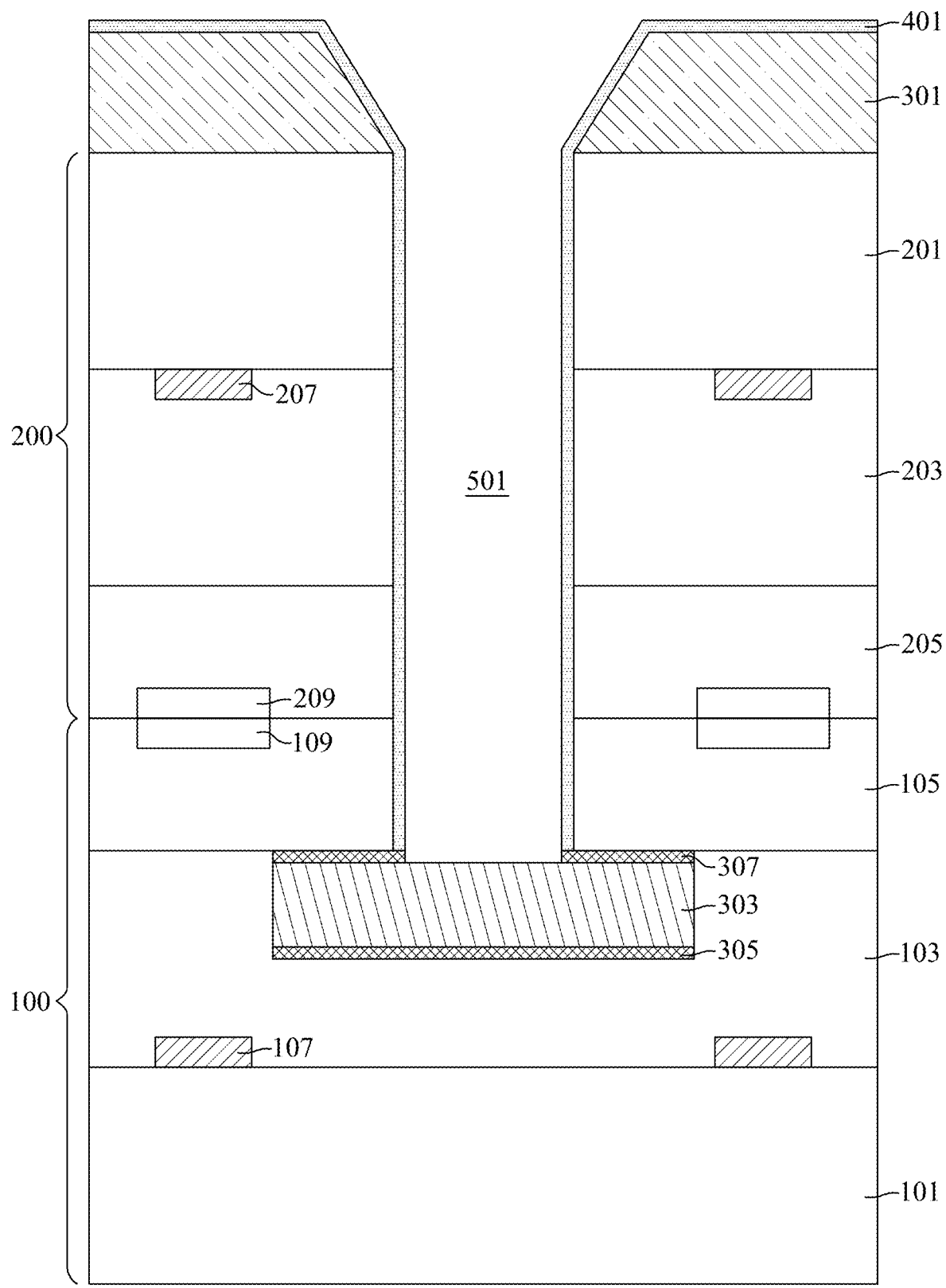

With reference to FIG. 13, the punch etch process may be performed to expose the portion of the top surface of the pad layer 303. Because of the isolation layer 401 formed on the interface IF01 between the passivation layer 301 and the isolation layer 401 and the isolation layer 401 formed on the top surface of the passivation layer 301 may have greater thicknesses comparing to the thickness of the isolation layer 401 formed on the top surface of the pad barrier layers 307. Therefore, the isolation layer 401 formed on the interface IF01 between the passivation layer 301 and the isolation layer 401 and the isolation layer 401 formed on the top surface of the passivation layer 301 may be only thinned down after the punch etch process.

Figure 14:
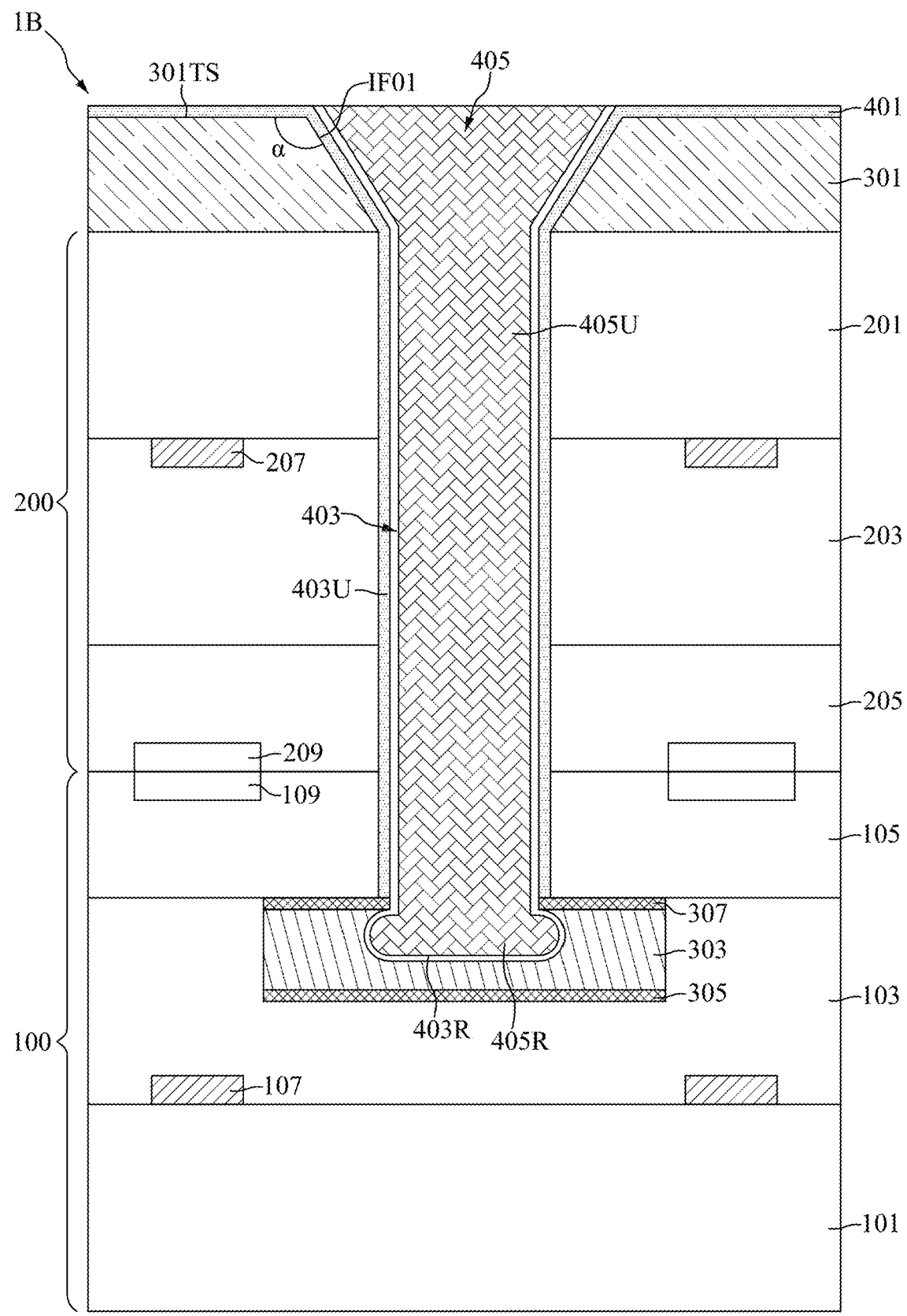

With reference to FIG. 14, the barrier layer 403, the adhesion layer, the seed layer, and the filler layer 405 may be formed with a procedure similar to that illustrated in FIGS. 7 to 10.

Figure 15:
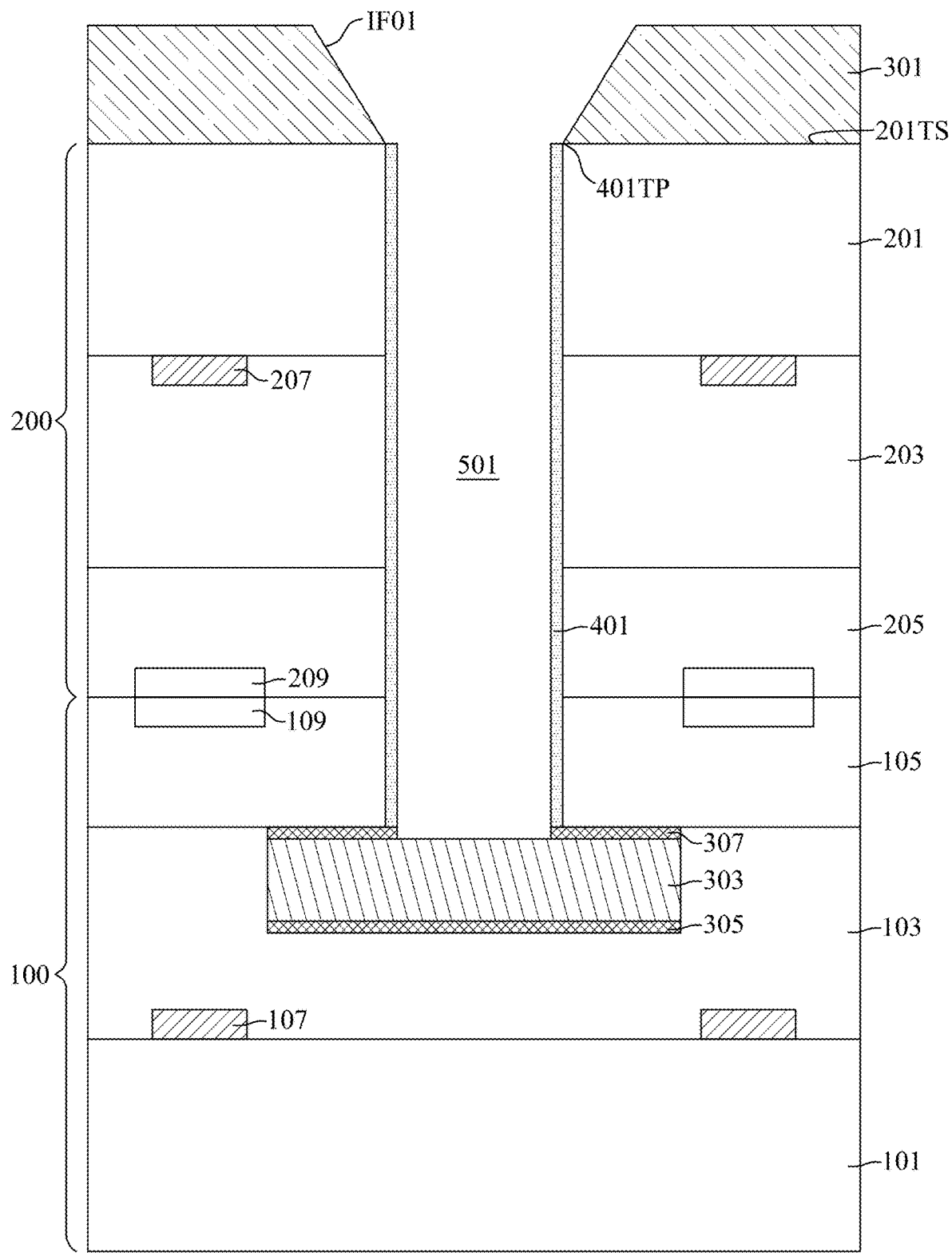
FIGS. 15 to 17 illustrate, in schematic cross-sectional view diagrams, a flow for fabricating a semiconductor device in accordance with another embodiment of the present disclosure.
Figure 16:
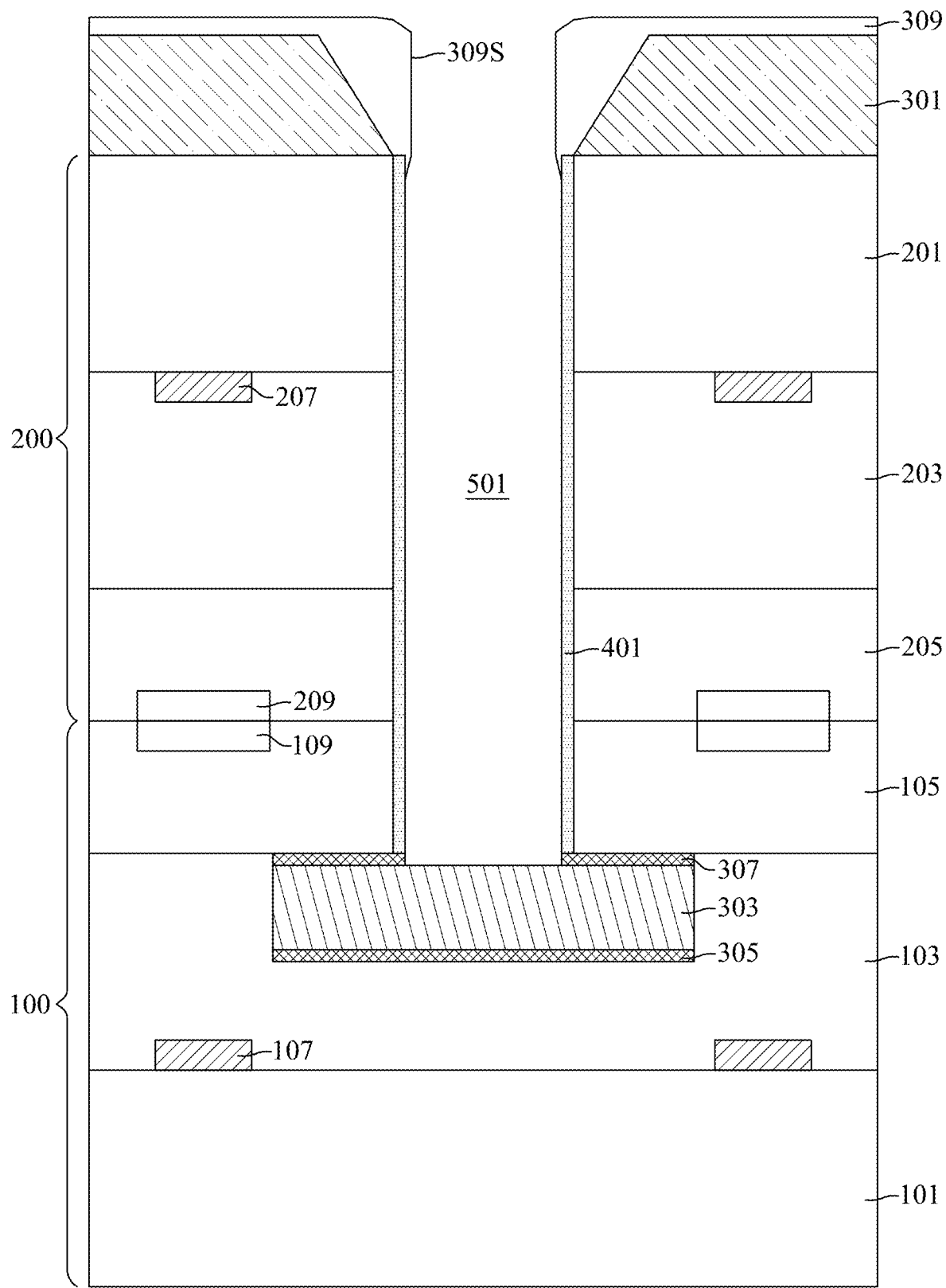
Figure 17:
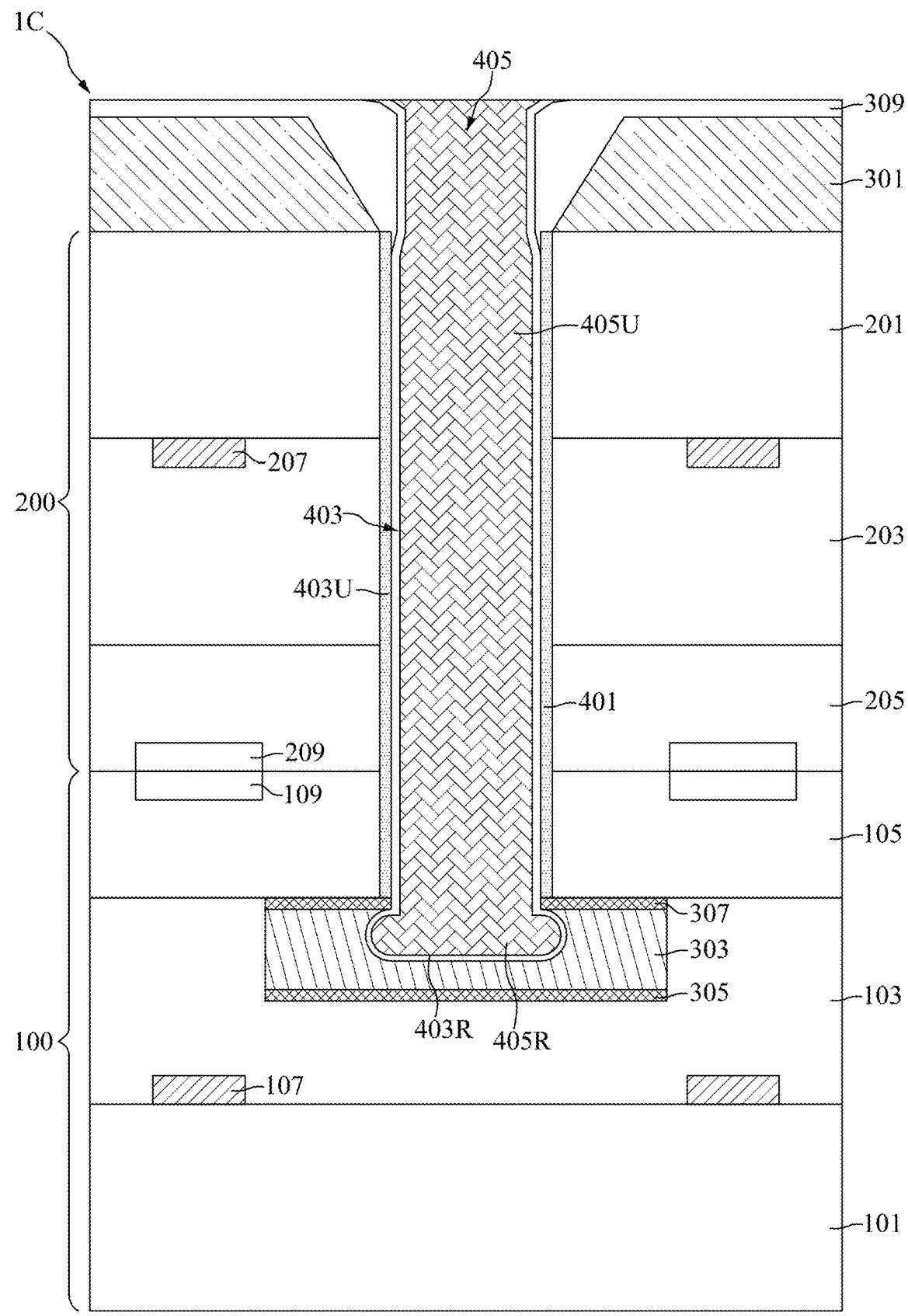

FIGS. 15 to 17 illustrate, in schematic cross-sectional view diagrams, a flow for fabricating a semiconductor device 1C in accordance with another embodiment of the present disclosure.

With reference to FIG. 15, an intermediate semiconductor device illustrated in FIG. 12 may be provided and a punch etch process may be performed. After the punch etch process, the portion of the top surface of the pad layer 303 may be exposed and the isolation layer 401 formed on the interface IF01 between the passivation layer 301 and the isolation layer 401 and the isolation layer 401 formed on the top surface of the passivation layer 301 may be removed. The topmost points 401TP of the isolation layer 401 may be at a vertical level equal to or lower than a vertical level of the top surface 201TS of the second substrate 201. While the topmost points 401TP of the isolation layer 401 is at the vertical level lower than the vertical level of the top surface 201TS of the second substrate 201. A metal to silicon leakage may occur during the formation of the filler layer 405.

With reference to FIG. 16, protection layers 309 may be formed to cover upper portions of the isolation layer 401. The protection layers 309 may be formed by a deposition process such as an atomic layer deposition method precisely controlling an amount of a first precursor of the atomic layer deposition method. The protection layers 309 may be formed of, for example, aluminum oxide, hafnium oxide, zirconium oxide, titanium oxide, titanium nitride, tungsten nitride, silicon nitride, or silicon oxide.

In some embodiments, when the protection layers 309 are formed of aluminum oxide, the first precursor of the atomic layer deposition method may be trimethylaluminum and a second precursor of the atomic layer deposition method may be water or ozone.

In some embodiments, when the protection layers 309 are formed of hafnium oxide, the first precursor of the atomic layer deposition method may be hafnium tetrachloride, hafnium tert-butoxide, hafnium dimethylamide, hafnium ethylmethylamide, hafnium diethylamide, or hafnium methoxy-t-butoxide and the second precursor of the atomic layer deposition method may be water or ozone.

In some embodiments, when the protection layers 309 are formed of zirconium oxide, the first precursor of the atomic layer deposition method may be zirconium tetrachloride and the second precursor of the atomic layer deposition method may be water or ozone.

In some embodiments, when the protection layers 309 are formed of titanium oxide, the first precursor of the atomic layer deposition method may be titanium tetrachloride, tetraethyl titanate, or titanium isopropoxide and the second precursor of the atomic layer deposition method may be water or ozone.

In some embodiments, when the protection layers 309 are formed of titanium nitride, the first precursor of the atomic layer deposition method may be titanium tetrachloride and ammonia.

In some embodiments, when the protection layers 309 are formed of tungsten nitride, the first precursor of the atomic layer deposition method may be tungsten hexafluoride and ammonia.

In some embodiments, when the protection layers 309 are formed of silicon nitride, the first precursor of the atomic layer deposition method may be silylene, chlorine, ammonia, and/or dinitrogen tetrahydride.

In some embodiments, when the protection layers 309 are formed of silicon oxide, the first precursor of the atomic layer deposition method may be silicon tetraisocyanate or $CH_3OSi(NCO)_3$ and the second precursor of the atomic layer deposition method may be hydrogen or ozone.

Due to the tapered sidewalls of the through-substrate opening 501 in the passivation layer 301, the sidewalls 309S of the protection layers 309 may be substantially vertical. The protection layers 309 may provide additional protection to the passivation layer 301 and the second die 200 during the subsequent semiconductor processes. Hence, the metal to silicon leakage while the formation of the filler layer 405 may be avoided. As a result, the performance/yield of the semiconductor device 1C may be improved.

It should be noted that, in the description of the present disclosure, a surface (or sidewall) is "vertical" if there exists a vertical plane from which the surface does not deviate by more than three times the root mean square roughness of the surface.

With reference to FIG. 17, the barrier layer 403, the adhesion layer, the seed layer, and the filler layer 405 may be formed with a procedure similar to that illustrated in FIGS. 7 to 10. In some embodiments, the planarization process as illustrated in FIG. 10 may be performed until the protection layers 309 is exposed. In some embodiments, the planarization process as illustrated in FIG. 10 may be performed until the passivation layer 301 is exposed. In some embodiments, the planarization process as illustrated in FIG. 10 may be performed until the second substrate 201 is exposed.

In addition, due to the presence of the protection layers 309, the deposition rate of the conductive material 505 on the sidewalls of the through-substrate opening 501 may be reduced. Hence, the deposition rate of the conductive material 505 on the sidewalls of the layer of conductive material 505 and the deposition rate of the conductive material 505 in the recessed space 503 may become close to each other. As a result, the through-substrate opening 501 and the recessed space 503 may be filled without any void formation. The yield of the semiconductor device 1C may be improved.

Figure 18:
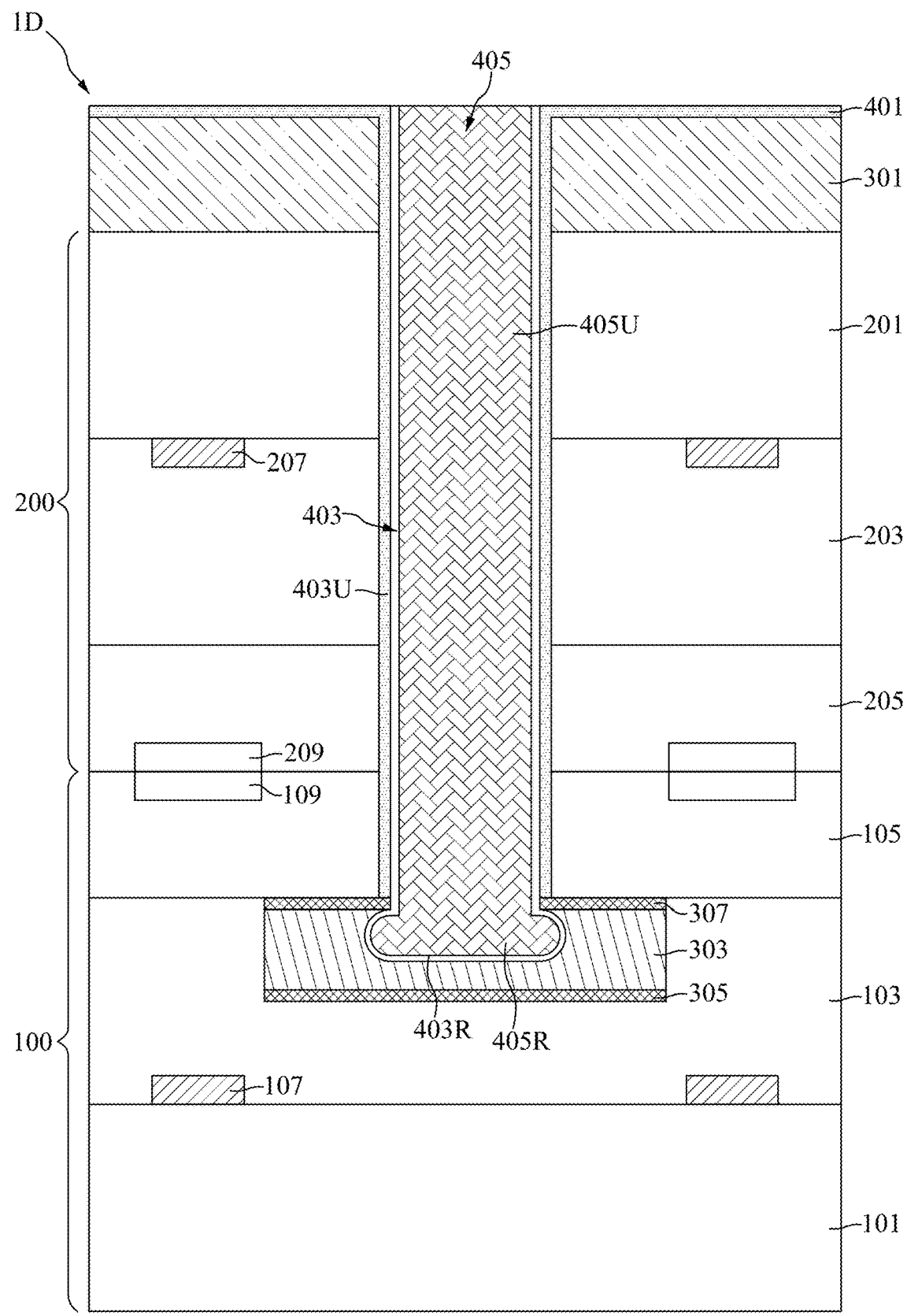
FIG. 18 illustrates, in a schematic cross-sectional view diagram, a semiconductor device in accordance with another embodiment of the present disclosure.

FIG. 18 illustrates, in a schematic cross-sectional view diagram, a semiconductor device 1D in accordance with another embodiment of the present disclosure.

With reference to FIG. 18, the semiconductor device 1D may be formed with a procedure similar to that illustrated in FIGS. 2 to 10. The major difference is that the pad layer 303 and the pad barrier layers 305, 307 are formed in the first bonding layer 105 of the first die 100 instead of the first dielectric layer 103 of the first die 100. The top surface of the pad barrier layer 307 may be substantially coplanar with the top surface of the first bonding layer 105.

One aspect of the present disclosure provides a semiconductor device including a first die, a second die positioned on the first die, a pad layer positioned in the first die, a filler layer including an upper portion and a recessed portion, and a barrier layer positioned between the second die and the upper portion of the filler layer, between the first die and the upper portion of the filler layer, and between the pad layer and the recessed portion of the filler layer. The upper portion of the filler layer is positioned along the second die and the first die, and the recessed portion of the filler layer is extending from the upper portion and positioned in the pad layer.

Another aspect of the present disclosure provides a method for fabricating a semiconductor device including performing a bonding process to bond a second die onto a first die including a pad layer, forming a through-substrate opening along the second die and extending to the pad layer in the first die, conformally forming an isolation layer in the through-substrate opening, performing a punch etch process to remove a portion of the isolation layer and expose a portion of a top surface of the pad layer, performing an isotropic etch process to form a recessed space extending from the through substrate opening and in the pad layer, conformally forming a barrier layer in the through-substrate opening and the recessed space, and forming a filler layer in the through-substrate opening and the recessed space.

Due to the design of the semiconductor device of the present disclosure, the upper portion 405U of the filler layer 405 may increase the contact surface between the filler layer 405 and the barrier layer 403 so as to achieve a reduced contact resistance of the barrier layer 403. As a result, the reliability of the semiconductor device 1A may be improved. In addition, due to the geometry of the protection layers 309, the filler layer 405 may be formed without any void. Accordingly, the yield of fabrication of the semiconductor device 1C may be improved.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a first die;
   a second die positioned on the first die;
   a pad layer positioned in the first die;
   a filler layer comprising an upper portion and a recessed portion, wherein the upper portion of the filler layer is positioned along the second die and the first die, and the recessed portion of the filler layer is extending from the upper portion and positioned in the pad layer; and
   a barrier layer positioned between the second die and the upper portion of the filler layer, between the first die and the upper portion of the filler layer, and between the pad layer and the recessed portion of the filler layer
   wherein a depth of the recessed portion of the filler layer is greater than one half of a thickness of the pad layer and less than the thickness of the pad layer.

2. The semiconductor device of claim 1, wherein a horizontal distance between sidewalls of the upper portion of the filler layer and sidewalls of the recessed portion of the filler layer is equal to or less than the depth of the recessed portion of the filler layer.

3. The semiconductor device of claim 2, wherein the sidewalls of the recessed portion of the filler layer are curved.

4. The semiconductor device of claim 2, wherein a bottom surface of the recessed portion of the filler layer is curved.

5. The semiconductor device of claim 3, further comprising isolation layers positioned between the second die and the upper portion of the filler layer and between the first die and the upper portion of the filler layer.

6. The semiconductor device of claim 5, further comprising a passivation layer positioned on the second die and the upper portion of the filler layer is positioned along the passivation layer, the second die, and the first die, wherein the passivation layer is formed of silicon nitride, silicon oxynitride, silicon oxide, silicon nitride oxide, epoxy, polyimide, benzocyclobutene, or polybenzoxazole.

7. The semiconductor device of claim 6, further comprising an adhesion layer positioned between the filler layer and the barrier layer, wherein the adhesion layer is formed of titanium, tantalum, titanium tungsten, or manganese nitride.

8. The semiconductor device of claim 7, further comprising a seed layer positioned between the adhesion layer and the conductive filler layer, wherein the seed layer has a thickness between about 10 nm and about 40 nm.

9. The semiconductor device of claim 8, further comprising pad barrier layers respectively correspondingly positioned on the pad layer and below the pad layer.

10. The semiconductor device of claim 9, wherein interfaces between the passivation layer and the upper portion of the filler layer are tapered.

11. The semiconductor device of claim 10, wherein an angle between a top surface of the passivation layer and the interfaces between the passivation layer and the upper portion of the filler layer is between about 120 degree and 135 degree.

12. The semiconductor device of claim 11, wherein the filler layer is formed of polysilicon, tungsten, copper, carbon nanotube, or solder alloy.

13. The semiconductor device of claim 12, wherein the isolation layers are formed of silicon oxide, silicon nitride, silicon oxynitride, or tetra-ethyl ortho-silicate.

* * * * *